United States Patent [19]

Campbell et al.

[11] Patent Number: 4,927,489

[45] Date of Patent: May 22, 1990

[54] METHOD FOR DOPING A MELT

[75] Inventors: Robert B. Campbell, Ben Avon Borough; Edgar L. Kochka, Greentree; Paul A. Piotrowski, Monroeville, all of Pa.

[73] Assignee: Westinghouse Electric Corp., Pittsburgh, Pa.

[21] Appl. No.: 201,228

[22] Filed: Jun. 2, 1988

[51] Int. Cl.⁵ .......................................... H01L 21/208
[52] U.S. Cl. ....................... 156/620.1; 156/DIG. 64; 156/DIG. 84; 156/DIG. 94; 437/115
[58] Field of Search ....... 156/605, DIG. 64, DIG. 84, 156/DIG. 94, 620.1, 620.4, 617.1; 422/246, 248; 437/2, 115

[56] References Cited

U.S. PATENT DOCUMENTS 3,093,520  6/1963  John et al. ............................ 148/33.5
4,428,783  1/1984  Gessert ..................................... 437/2

OTHER PUBLICATIONS

Seidensticker, "Densritic Web Growth of Silicon", 8 *Crystals* 145 (1982), pp. 145-235.
Seidensticker et al., "Silicon Ribbon Growth by the Dendritic Web Process", *Journal of Crystal Growth* 50, pp. 221-235, 1979.

Primary Examiner—Melvyn J. Andrews

[57] ABSTRACT

A method for doping a silicon melt for growing silicon dendritic web crystals is disclosed. The melt is doped with antimony prior to commencing web growth, which allows the crystals to be grown without the need for replenishing the dopant, and producing crystals having uniform resistivities. Photovoltaic cells produced from crystals grown from the antimony doped melt exhibit superior properties relative to those doped according to other methods.

2 Claims, 4 Drawing Sheets

1

METHOD FOR DOPING A MELT

FIELD OF THE INVENTION

The present invention relates to methods for doping a melt, specifically a silicon melt used for growing silicon dendritic web crystals, and the crystals grown from the doped melt.

BACKGROUND OF THE INVENTION

Dendritic web crystals are grown according to known methods by withdrawing (growing) a continuous ribbon or web from a pool of molten silicon. See, for example, U.S. Pat. No. 4,389,377. Generally, the method involves placing a silicon charge in a quartz crucible which is housed in a susceptor, placing heat shields over the crucible, melting the silicon using an inductive coil heater or other known heating methods, placing a seed dendrite in the melt, undercooling to form a button and pulling the button from the melt to drop dendrites from each end of the button. The dendrites grow into the melt and on continued pulling of the button from the melt, the dendrites support a liquid film of silicon that freezes as the material passes through a slot in the shields, thereby growing a single crystal silicon ribbon (also known as silicon dendritic web), between the dendrites.

In the standard growth process, precise amounts of boron or phosphorous are added to the molten silicon so that as the ribbon is growing, boron or phosphorous atoms are included in the ribbon structure to form a p-type or n-type crystal, respectively. N-type crystals are those having an excess of electrons, while p-type crystals are those having an excess of holes. The concentration of these "impurity" atoms in the silicon ribbon determines the base resistivity of the crystal, a key parameter in the efficiency of photovoltaic cells produced from a silicon ribbon crystal.

However, the use of phosphorus as a dopant has certain drawbacks. Dendritic web crystals are generally grown according to a semi-continuous process, whereby silicon feedstock is injected into the growth furnace as the ribbon crystals are being withdrawn. Maintaining uniform resistivity in an n-type phosphorous doped web requires that the dopant be replenished continuously along with the silicon to maintain a constant dopant concentration in the melt. However, it is extremely difficult to control the addition of phosphorus to the melt in order to obtain a uniform resistivity along the entire length of a ribbon crystal which is typically five to fifteen meters long and requires 5 to 15 hours of growing time. Thus, it would be useful to develop a doping method whereby the resistivity of the crystal could be controlled to be more uniform. It would also be useful to develop a method of doping in which there would be no need to replenish the dopant added after the initial charge.

Although the inventors are aware of no publications to this effect, it is believed that antimony may have been used as a dopant in the Czochralski crystal growth process, in the growth of n-type boules. However, antimony, if used at all, is not used as a dopant for any specific reason in Czochralski growth other than in order to conduct certain tests. Normally, n-type Czochralski boules are grown with phosphorus doping.

SUMMARY OF THE INVENTION

The present invention solves the problems of prior doping schemes by providing a doping method which includes the addition of antimony as a dopant, which results in crystals having a nearly uniform resistivity over the entire length of the crystal. The method of the present invention does not require the addition of antimony dopant after the initial charge, thereby significantly simplifying the crystal growing process. Crystals grown from melts doped according to the present invention exhibit superior properties relative to prior art methods, such as unexpectedly high photovoltaic cell efficiencies.

Processing of photovoltaic cells fabricated from web crystals which were lightly doped ($5 \times 10^{14}$ atoms Sb per cm$^3$ Si web) with antimony was performed. These cells had measured efficiencies as high as 16.8%, were quite thin (117 $\mu$m) and had no surface passivation or texturing. Measurements of internal quantum efficiency showed a strong red response, with a minority carrier diffusion length of 272 $\mu$m, indicating superior quality material. These measurements were corroborated by measurements at Sandia National Laboratories. Sandia measurements gave efficiencies as high as 16.7% (AM 1.5, global, 25° C.), with internal quantum efficiencies very similar to those measured by the inventors.

Other details, objects and advantages of the invention will become apparent as the following description of the presently preferred embodiments and presently preferred methods of practicing the invention proceeds.

BRIEF DESCRIPTION OF THE DRAWINGS

The invention will become more readily apparent from the following description of preferred embodiments thereof shown, by way of example only, in the accompanying drawings, wherein.

DETAILED DESCRIPTION OF THE INVENTION

According to the present invention, a silicon melt used for growing silicon dendritic web crystals is doped with antimony, preferably in quantities of at least $1.8 \times 10^{15}$ atoms of antimony/gram of silicon melt. The antimony may be added directly to the melt in pellet form, or may be diffused into a silicon substrate, such as a silicon wafer, on a heavily doped silicon wafer. These dopant sources are added to the melt prior to starting the crystal growth process. The antimony may either be added before or after the silicon is melted. In either case, the antimony is allowed to melt and diffuse throughout the silicon melt before commencing crystal growth.

Antimony (Sb) is an n-type dopant with a low segregation coefficient in silicon. The segregation coefficient is the ratio of dopant concentration in a molten solution to the dopant concentration in the solidified crystal produced from that molten solution. The segregation coefficient of antimony in silicon is 0.023 as compared to 0.35 for phosphorous in silicon. It is preferable, in order to achieve acceptable photovoltaic cell efficiencies, for dendritic web crystals to have resistivities in the 4–50 Ωcm range. In order to achieve this range of resistivity, the antimony concentration must be 15 times greater than the phosphorous concentration in the molten silicon used to produce similar crystals having similar resistivities. During the growth process, the concentration of antimony in the molten silicon drops 15 times more slowly as compared to phosphorous. Extremely long crystals have been grown with substantially uniform resistivity and with no replenishment of the antimony dopant. In fact, entire growth runs (5 days) with a total grown crystal weight of 600 grams have been made with no dopant additions during growth. In these runs, the web resistivity varied within the above 4–50 Ωcm specification limits.

Figure 1:
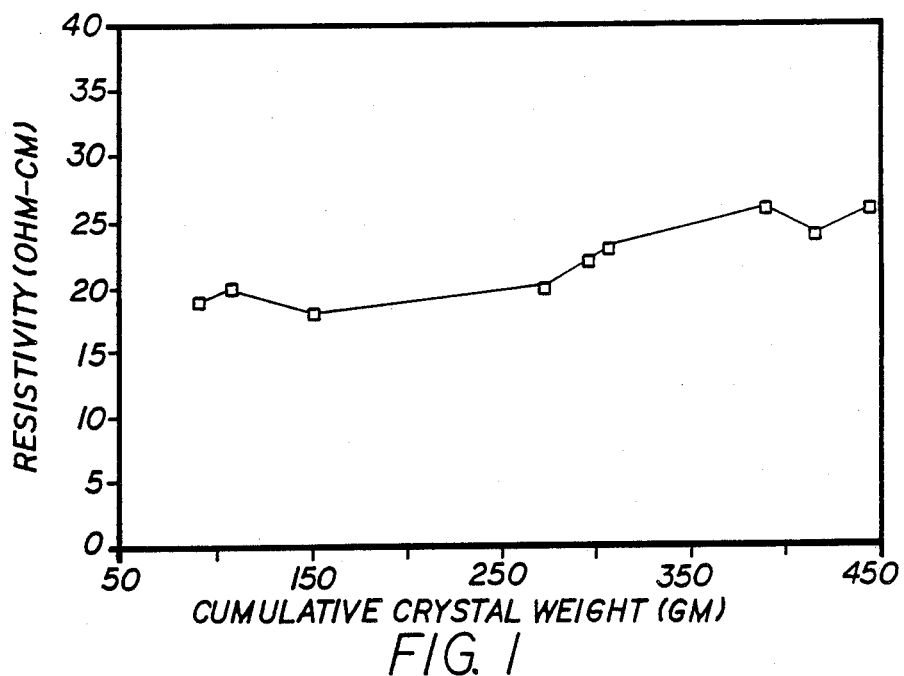
FIGS. 1–3 are graphs showing the resistivity of web crystals grown from melts doped according to the present invention versus the cumulative weight of all crystals grown from the melt.
Figure 2:
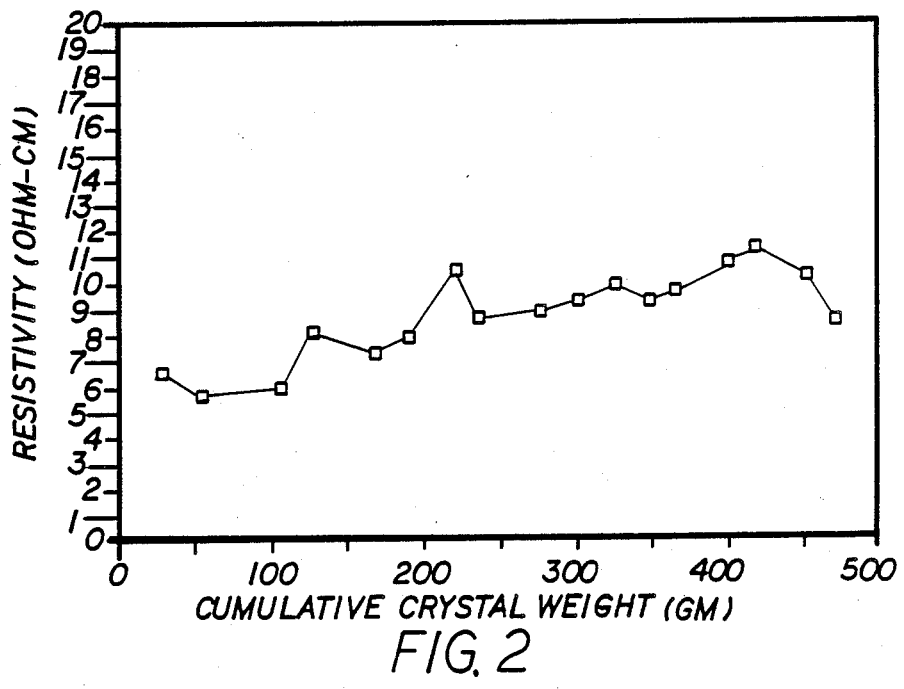
Figure 3:
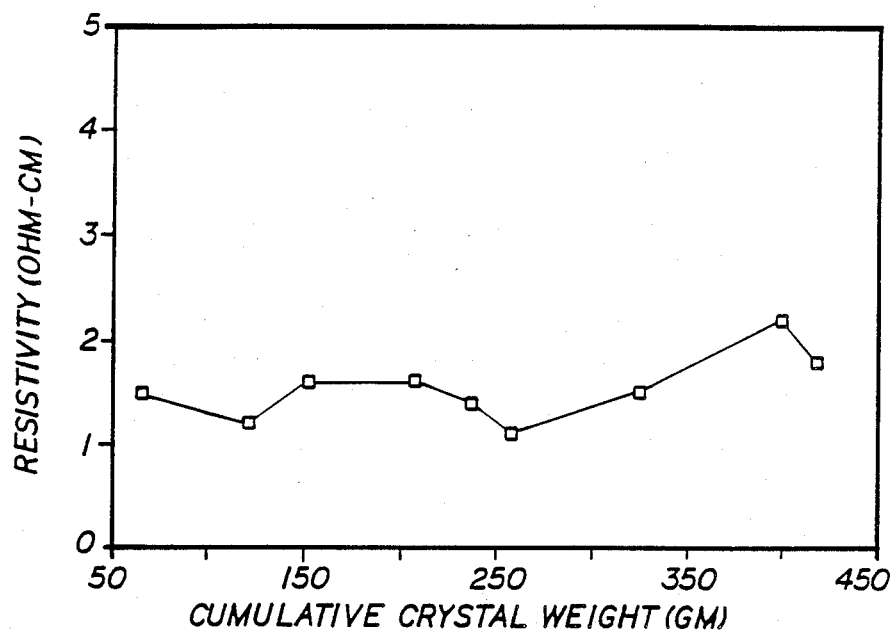

FIGS. 1-3 show the resistivity of web crystals grown in three growth runs from melts doped with antimony according to the present invention. In these figures, the resistivity of a given crystal is plotted against the cumulative weight of all crystals grown up to that time, in other words, the total amount of silicon removed from the charge.

The initial resistivity was controlled by the amount of antimony added to the charge. FIG. 1 shows the data for a run of crystals grown from a melt having $1.8 \times 10^{18}$ antimony atoms in the charge, in which the resistivity varied from 20 Ωcm to 27 Ωcm over the course of the run. FIG. 2 shows data for a run having $2.44 \times 10^{18}$ antimony atoms in the charge, in which the resistivity varied from 6 Ωcm to 13 Ωcm. Similarly, FIG. 3 shows data on yet another run having $7.4 \times 10^{18}$ atoms of antimony in the charge, in which the resistivity varied from 1.2 Ωcm to 2.2 Ωcm. In all cases the silicon charge was 280 grams, which was replenished with silicon as needed, however, no further antimony dopant was added over the course of each respective run. These variations for FIGS. 1, 2 and 3 are within specification limits of the grown web. FIGS. 1-3 indicate that uniform resistivity material over a wide range of resistivities can be grown using antimony doping in the initial charge and with no further doping required, even though silicon is added to the charge during the run to replace the silicon used in the grown web. As used herein, the term "uniform resistivity" is defined to mean a resistivity falling within the specified range of 4–50 Ωcm.

Antimony is also advantageous as an n-type dopant because of its low diffusion constant. Dopant atoms in the vicinity of the web surface can diffuse out of the material when the web is at high temperatures in the growth furnace. Because of its low diffusion constant in silicon, antimony tends to remain in the web material while other dopants, such as phosphorous, diffuse out. When antimony is used, the dopant profile through the thickness of the web remains uniform, even for light doping. This is not necessarily the case when phosphorous is used as the dopant.

In addition, the doping along the length of the web crystals (and even from crystal to crystal) remains nearly constant because of the low segregation coefficient (0.023) of antimony in crystalline silicon as compared to 0.35 for phosphorous. This has the important practical benefit that the antimony dopant need only be added to the starting silicon charge at the beginning of the growth run. The furnace can then produce web crystals over its full operating cycle (five days) without the need to add additional dopant to the melt, despite the fact that silicon is replenished to maintain a constant melt level as the crystal is withdrawn.

Figure 4:
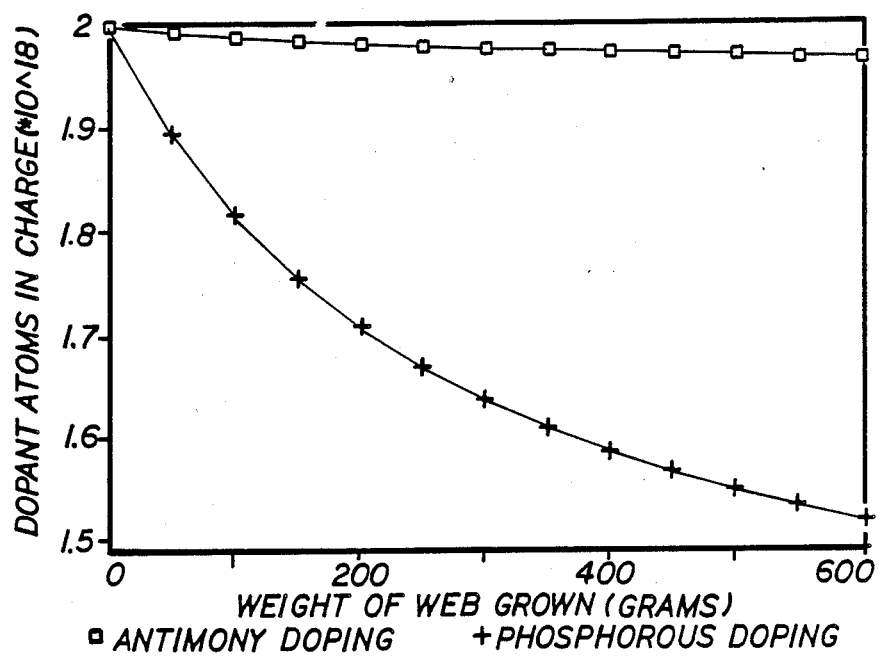
FIG. 4 is a graph which compares the calculated depletion of dopant atoms of phosphorus and antimony in a charge.

FIG. 4 illustrates a graphical comparison of the calculated depletion of dopant atoms in a silicon charge. The graph plots number of dopant atoms in the charge ($\times 10^{18}$) versus the weight of web grown in grams. As illustrated, the amount of phosphorous in the charge (symbolized by +) is depleted by nearly 25% after growth of 600 grams of web, while the amount of antimony in the charge (symbolized by □) is depleted by less than 5% over the same amount of web growth.

Figure 5:
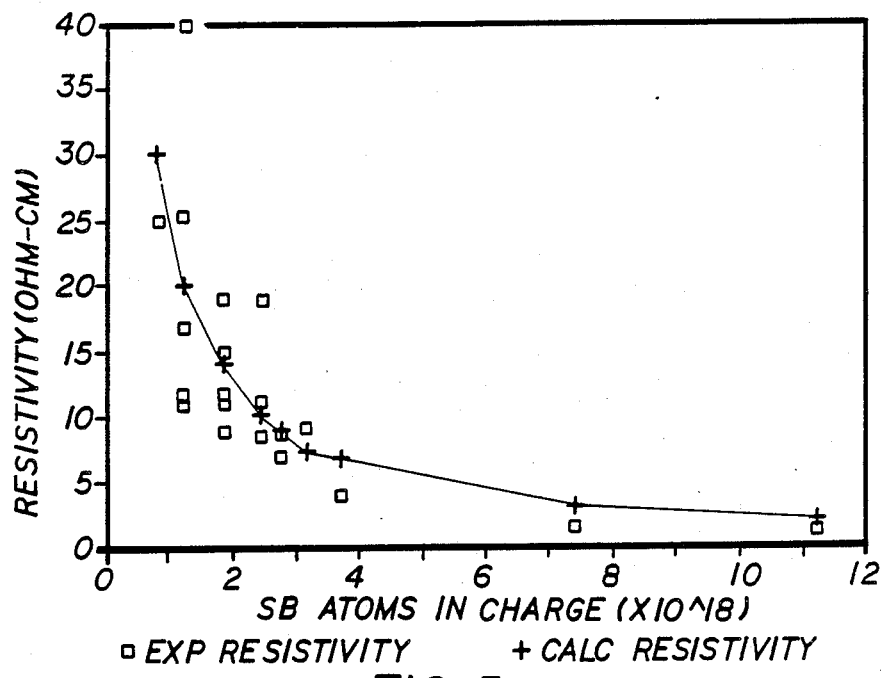
FIG. 5 is a graph which illustrates the average resistivity of crystals grown from melts doped according to the present invention versus the number of antimony dopant atoms in the initial charge.

FIG. 5 illustrates the average resistivity (ohm-cm) of all crystals grown from a melt doped with antimony according to the present invention versus the number of antimony dopant atoms ($\times 10^{18}$) added to the initial charge. The solid line shown in this figure is the calculated resistivity based on the original dopant concentration in the charge. There is good agreement between the calculated curve and the experimental data. As seen in this figure, runs of antimony doped web with resistivities ranging from 2 Ωcm to 40 Ωcm have been grown with similar results; that is, the resistivity remained relatively constant without any dopant being added during the runs.

A number of photovoltaic cells have been fabricated on crystals produced in the antimony doped growth runs discussed above. In addition to obtaining uniform dopant profiles with antimony, cell data indicates that antimony may be responsible for increasing hole diffusion lengths in web material. The mechanism by which this occurs is not readily understood at this time, but it may be related to the fact that the antimony has a strong affinity for oxygen. It is conceivable that the antimony is affecting the oxygen content or the oxygen distribution in web material and is proving to be beneficial to its electrical quality. What has been shown recently is that superior web cells with a conventional p+nn+ structure can be made with thin (~100 μm) material which is lightly doped ($5 \times 10^{14}$ atoms Sb per cm$^3$ of Si web) with antimony.

In the fabrication of these cells, a boron diffusion (BBr$_3$) was used to create the front p+n junction, and a phosphorous diffusion (POCl$_3$) was used for the back n+n high-low junction. An aluminum layer was deposited on the back of the cell for a back surface reflector (BSR), but no surface passivation or texturing was employed.

Table 1 shows lighted IV and diffusion length data recorded for a number of web strips produced throughout a 5 day growth run. The cell data are remarkably uniform considering that more than 35 meters of web crystal were grown between the first crystal (4-413-1.2) and the last (4-413-13.8). The resistivity only varied from 9 Ωcm to 15 Ωcm from the beginning to the end of the run with no dopant added during the run.

TABLE 1

HIGH QUALITY CELLS (NO AR COATING) FROM LIGHTLY DOPED N-TYPE WEB CRYSTALS FROM A SINGLE GROWTH RUN (RUN SBWEB-1)

| Cell ID | Web Crystal | $J_{sc}$ (mA/cm$^2$) | $V_{oc}$ (V) | FF | $\eta$ (%) | $L_p$(SPV) ($\mu$m) |
|---|---|---|---|---|---|---|
| 1.2-1 | 4-413-1.2 | 24.0 | 0.580 | 0.777 | 10.82 | 197 |
| 1.2-2 | 4-413-1.2 | 24.4 | 0.581 | 0.776 | 11.03 | 191 |
| 1.2-3 | 4-413-1.2 | 24.2 | 0.580 | 0.774 | 10.90 | |
| 1.2-4 | 4-413-1.2 | 24.2 | 0.579 | 0.774 | 10.85 | |
| 1.3-1 | 4-413-1.3 | 23.5 | 0.558 | 0.692 | 9.09 | |
| 1.3-2 | 4-413-1.3 | 23.6 | 0.567 | 0.731 | 9.78 | |
| 1.3-3 | 4-413-1.3 | 23.6 | 0.572 | 0.753 | 10.16 | |
| 1.3-4 | 4-413-1.3 | 23.4 | 0.567 | 0.766 | 10.18 | |
| 3.5-1 | 4-413-3.5 | 23.0 | 0.556 | 0.778 | 9.96 | |
| 3.5-2 | 4-413-3.5 | 23.2 | 0.558 | 0.781 | 10.12 | |
| 3.5-3 | 4-413-3.5 | 23.2 | 0.558 | 0.775 | 10.06 | |
| 3.5-4 | 4-413-3.5 | 23.3 | 0.561 | 0.782 | 10.20 | |
| 3.6-1 | 4-413-3.6 | 23.3 | 0.552 | 0.780 | 10.05 | |
| 3.6-2 | 4-413-3.6 | 23.4 | 0.548 | 0.778 | 9.97 | |
| 3.6-3 | 4-413-3.6 | 22.6 | 0.553 | 0.778 | 9.71 | |
| 6.4-1 | 4-413-6.4 | 23.8 | 0.558 | 0.783 | 10.43 | |
| 6.4-2 | 4-413-6.4 | 23.6 | 0.555 | 0.778 | 10.20 | |
| 6.4-3 | 4-413-6.4 | 23.6 | 0.555 | 0.779 | 10.22 | |
| 6.4-4 | 4-413-6.4 | 23.4 | 0.553 | 0.773 | 10.00 | |
| 6.5-1 | 4-413-6.5 | 23.6 | 0.553 | 0.763 | 9.96 | |
| 6.5-2 | 4-413-6.5 | 23.8 | 0.553 | 0.776 | 10.20 | |
| 6.5-3 | 4-413-6.5 | 23.7 | 0.550 | 0.776 | 10.11 | |
| 6.5-4 | 4-413-6.5 | 23.5 | 0.553 | 0.780 | 10.13 | |
| 10.5-1 | 4-413-10.5 | 23.7 | 0.557 | 0.699 | 9.21 | |
| 10.5-2 | 4-413-10.5 | 24.0 | 0.562 | 0.765 | 10.30 | |
| 10.5-3 | 4-413-10.5 | 24.0 | 0.561 | 0.774 | 10.42 | |
| 10.5-4 | 4-413-10.5 | 23.8 | 0.561 | 0.774 | 10.31 | |
| 10.6-2 | 4-413-10.6 | 21.9 | 0.521 | 0.775 | 8.84 | |
| 10.6-3 | 4-413-10.6 | 22.9 | 0.533 | 0.778 | 9.48 | |
| 10.6-4 | 4-413-10.6 | 23.0 | 0.536 | 0.777 | 9.60 | |
| 12.2-1 | 4-413-12.2 | 23.8 | 0.565 | 0.772 | 10.34 | 243 |
| 12.2-2 | 4-413-12.2 | 24.0 | 0.567 | 0.773 | 10.53 | 210 |
| 12.2-3 | 4-413-12.2 | 24.0 | 0.562 | 0.761 | 10.27 | |
| 12.2-4 | 4-413-12.2 | 23.7 | 0.566 | 0.775 | 10.40 | |
| 13.8-1 | 4-413-13.8 | 22.6 | 0.545 | 0.785 | 9.66 | |
| 13.8-2 | 4-413-13.8 | 22.7 | 0.553 | 0.783 | 9.82 | |
| FZ-3 | Float Zone | 25.2 | 0.593 | 0.785 | 11.73 | 451 |

Notes to Table 1:
1. Cell area is 1.00 cm$^2$ and cells had no antireflective coating.
2. Measurement conditions: AM 1.5, 100 mW/cm$^2$, 25° C.
3. Web growth run 4-413 produced 14 crystals.
4. Web growth crystals were n-type, 9 to 15 ohm-cm, with thicknesses ranging from 111 to 146 $\mu$m.
5. Float-zone wafer (J-88412) had a (100) surface, was doped n-type to 5-8 ohm-cm, and was 280 $\mu$m thick.

Notes to Table 1: 1. Cell area is 1.00 cm$^2$ and cells had no antireflective coating. 2. Measurement conditions: AM1.5, 100 mW/cm$^2$, 25° C. 3. Web growth run 4-413 produced 14 crystals. 4. Web growth crystals were n-type, 9 to 15 ohm-cm, with thicknesses ranging from 111 to 146 $\mu$m. 5. Float-zone wafer (J-88412) had a (100) surface, was doped n-type to 5-8 ohm-cm, and was 280 $\mu$m thick.

Two sections of web crystals were chosen for deposition of an evaporated double layer antireflective coating (600 angstroms of ZnS and 1000 angstroms of MgF$_2$). One section was from a crystal grown at the beginning of the run (4-413-1.2), and the other section was from a crystal grown near the end of the five-day run (4-413-12.2).

Pertinent data measured for these cells are given in Table 2. The highest efficiency obtained was 16.8% (AM 1.5, 1000 mW/cm$^2$, 25° C.), with a $J_{sc}$ of 36.5 mA/cm$^2$, a $V_{oc}$ of 0.589 V, and a FF of 0.781. The hole diffusion length in the base of these cells is typically 200 $\mu$m, as measured by the surface photovoltage technique; and the thickness is approximately 115 $\mu$m. It is noteworthy that such high efficiencies can be obtained from material produced near the end of a five-day growth run, indicating that the electrical quality of the web material remains high throughout the entire run.

TABLE 2

LIGHTLY-DOPED, THIN, HIGH EFFICIENCY DENDRITIC WEB SILICON SOLAR CELLS

| Cell ID | $J_{sc}$ (mA/cm$^2$) | $V_{oc}$ (V) | FF | $\eta$ (%) | $L_p$(SPV) ($\mu$m) |
|---|---|---|---|---|---|
| A. Cells Produced from First Web Crystal of Growth Run 4-413-1.2 (117 $\mu$m thick) | | | | | |
| 1.2-1 | 36.1 | 0.589 | 0.784 | 16.6 | 197 |
| 1.2-3 | 36.4 | 0.589 | 0.777 | 16.7 | 191 |
| 1.2-4 | 36.5 | 0.589 | 0.781 | 16.8 | — |
| B. Cells Produced From Twelfth Web Crystal of Growth Run 4-413-12.2 (110 $\mu$m thick) | | | | | |
| 12.2-1 | 35.9 | 0.580 | 0.774 | 16.1 | 243 |
| 12.2-2 | 36.1 | 0.580 | 0.772 | 16.1 | 210 |
| 12.2-4 | 35.8 | 0.581 | 0.773 | 16.1 | — |

Notes to Table 2:
1. Web Crystals are doped n-type with antimony at a concentration of $5 \times 10^{14}$ atoms Sb per cm$^3$ of silicon web.
2. Cell size is 1 × 1 cm, defined by a mesa.
3. Cell structure is p$^+$nn$^+$ with a DLAR (600 angstrom ZnS and 1000 angstrom MgF$_2$) and aluminum BSR. No surface passivation or texturing was used. (Run SBWEB-1).
4. Measurement conditions: AM1.5, 100 mW/cm$^2$, 25° C. (measured at Westinghouse R & D Center).

The cells listed in Table 2 were sent to Sandia National Laboratories for an independent measurement of cell parameters, courtesy of Dr. D. Arvizu. The values given in Table 2 were corroborated at Sandia, with the efficiencies measured at Sandia generally ~0.2% (absolute) lower than those given in Table 2. The Sandia measurements included a correction for the small difference between their illumination source and the true AM 1.5 global spectrum (spectral mismatch). The global spectrum is appropriate for cells intended for use in flat plate arrays rather than concentrator arrays. The cell (1.2-4) with the highest efficiency (16.7%) had a $J_{sc}$ of 36.7 mA/cm$^2$, a $V_{oc}$ of 0.586 V, and a FF of 0.774 according to the Sandia measurements (AM 1.5 global, 100 mW/cm$^2$, 25° C.). This efficiency represents the highest independently-measured value for any web photovoltaic cell yet produced.

Figure 6:
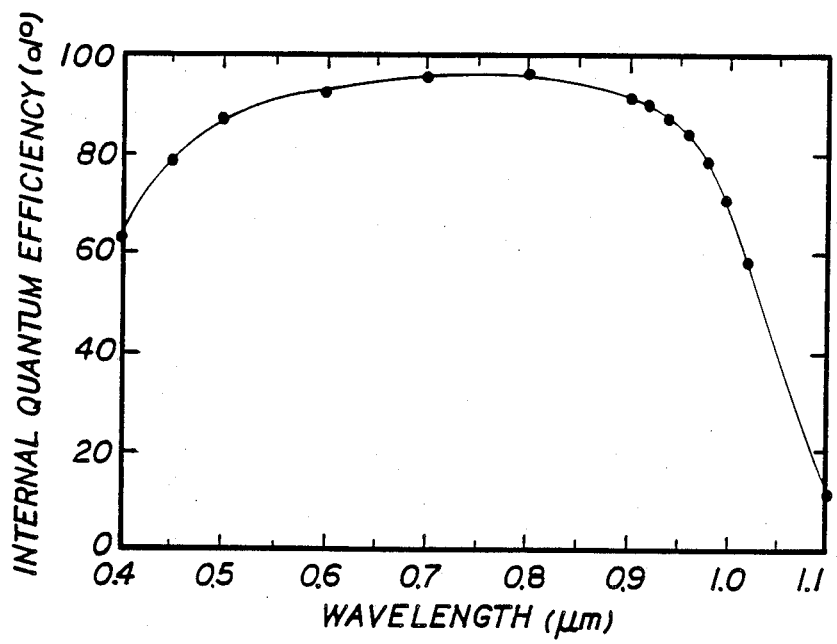
FIG. 6 is a graph illustrating internal quantum efficiency versus wavelength for a thin web photovoltaic cell produced from web crystal grown from a melt doped according to the present invention.

Measurements of internal quantum efficiency for cells 1.2-1 and 12.2-4 were also made at Sandia from 0.35 $\mu$m to 1.10 $\mu$m. These measurements were in agreement with similar measurements made by the inventors, as given in FIG. 6 for cell 1.2-4. FIG. 6 plots the internal quantum efficiency (%) versus wavelength ($\mu$m) for web cell 4-413-1.2-4 having a thickness of 117 $\mu$m, a p$^+$nn$^+$ structure, a base doping with antimony of $5 \times 10^{14}$ atoms Sb/cm$^3$ of silicon web, and an efficiency of 16.8%. The measurement of internal quantum efficiency showed a strong red response of the cell, as expected for material in which the diffusion length significantly exceeds the thickness, but only a modest blue response. This is consistent with a long diffusion length in the cell base and the absence of surface passivation, respectively. If surface passivation (thin thermal oxide) improves the blue response, then cell efficiencies exceeding 17% may be obtained.

Figure 7:
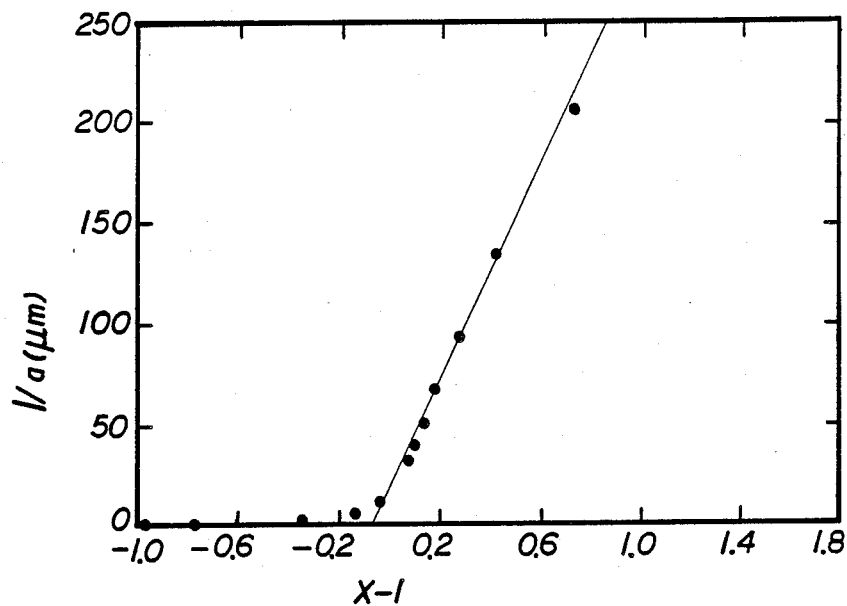
FIG. 7 is a graph used to determine hole diffusion length from quantum efficiency data for a web photovoltaic cell produced from web crystal grown from a melt doped according to the present invention.

An estimate of the hole diffusion length in the base of cell 1.2-4 can be made from the quantum efficiency data. The reciprocal of the spectral absorption coefficiency ($\beta$) is plotted against X-1, where X is the ratio of the number of photons absorbed in the base per unit time to the number of electrons diffused from the base into the emitter per unit time. The slope of such a plot is a measure of the hole diffusion length. From FIG. 7, the value of diffusion length is determined to be 272 $\mu$m for web cell 4-413-1.2-4 having a thickness of 117 $\mu$m.

The hole lifetime in the base of antimony doped web cells was also measured by the OCD open circuit decay) technique. These cells were fully processed, including the double layer antireflective coating. The results are summarized in Table 3 for cells fabricated from web crystals grown near the beginning (4-413-1.2) and near the end (4-413-12.2) of a five day run. The cell area is 1.00 cm$^2$, and an injection current of approximately 30 mA was used in the measurement. Lifetimes as high as 66.5 $\mu$s were measured. The corresponding hole diffusion lengths were calculated from the measured lifetimes, assuming the diffusion constant for holes is 11.9 cm$^2$/V-sec, for the web material doped with antimony to $5 \times 10^{14}$ atoms Sb cm$^{-3}$ of silicon web. Such calculated diffusion lengths ranged from 226 to 281 $\mu$m, which considerably exceed the thickness of the cells (110 and 117 $\mu$m) (see note 3 to Table 3). These diffusion lengths are in good agreement with values obtained from quantum efficiency measurements. The efficiencies measured for the cells prior to the application of the antireflective coating are also listed in Table 3.

TABLE 3

MEASURED LIFETIME FOR THIN WEB CELLS
LIGHTLY DOPED WITH ANTIMONY (RUN SBWEB-1)

| Cell ID | $\tau_p$(OCD) ($\mu$s) | $L_p = D_p \tau_p$ ($\mu$m) | $\eta$ (without AR) (%) |
|---|---|---|---|
| 4-413-1.2-2 | 66.5 | 281 | 11.03 |
| 4-413-1.2-3 | 65.7 | 280 | 10.90 |
| 4-413-1.2-4 | 61.5 | 271 | 10.85 |
| 4-413-12.2-1 | 43.1 | 226 | 10.34 |
| 4-413-12.2-2 | 50.3 | 245 | 10.53 |

Notes to Table 3:
1. Lifetime in finished cells measured by open circuit voltage decay (OCD) with an injected amount of approximately 30 mA (cell area is 1.00 cm$^2$).
2. $D_p$ taken to be 11.9 cm$^2$/V-sec based on antimony doping of approximately $5 \times 10^{14}$cm$^{-3}$ for calculating $L_p$ from $\tau_p$.
3. Cells from crystal 4-413-1.2 are 117 $\mu$m thick and from crystal 4-413-12.2 are 100 $\mu$m thick.

few recombination centers. Therefore, the antimony doped web is at least as high quality as the phosphorous doped material but has the added advantage of producing uniform resistivity throughout the run without requiring dopant additions. The efficiencies given are for illumination on the front surface. When illuminated from the back, the cell efficiency was 95–97% that of the front (after adjustment for the metal coverage on the back). This data confirms that cell diffusion lengths in excess of the 100–150 $\mu$m cell thickness have been maintained on full size cells during processing operations using standard processing equipment.

TABLE 4

Test Data On Cells Fabricated On Antimony Doped Web

| Cell ID | Growth Run | Resistivity ($\Omega$ cm) | $V_{oc}$ (V) | $I_{sc}$ (A) | FF | Eff. (%) |
|---|---|---|---|---|---|---|
| 12B | 6429 | 20 | .580 | .777 | .77 | 14.2 |
| 16B | 6429 | 20 | .596 | .774 | .79 | 14.7 |
| 17A | 6429 | 20 | .561 | .772 | .79 | 13.9 |
| 49A | 6430 | 17 | .597 | .726 | .77 | 13.8 |
| 53A | 6430 | 16 | .597 | .744 | .79 | 14.4 |
| 20 | 6430 | 21 | .596 | .740 | .78 | 14.0 |
| 10 | 6434 | 10 | .585 | .746 | .77 | 13.7 |

Data on front and back surface illumination for three further cells is shown in Table 5. A maximum efficiency of 15.3% was obtained. Since these cells were thin (about 115 $\mu$m) and did not have a back surface reflector, about 10% of the incident light in the AM 1.5 spectra passed through the cell without being absorbed. If these transmitted photons were absorbed and collected, the cell efficiency would approach 16%. Of special interest in this table are the high values of the short circuit current and efficiency developed under back surface illumination. This indicates a very high quality bulk material with diffusion lengths well in excess of the cell thickness.

TABLE 5

MEASURED PARAMETERS FOR ANTIMONY DOPED BIFACIAL WEB CELLS

| Cell | Crystal | Resistivity ($\Omega$ cm) | Area (cm$^2$) | Illumination | $J_{sc}$ (mA/cm$^2$) | $V_{oc}$ (V) | FF | $\eta$ (%) | $J_{sc}$ (back)/ $J_{sc}$ (front) |
|---|---|---|---|---|---|---|---|---|---|
| 75B | 6-434-6.6 | 9 | 24.5 | front | 31.8 | 0.593 | 0.809 | 15.3 | 0.95 |
|  |  |  | 21.2 | back | 30.3 | 0.587 | 0.791 | 14.1 |  |
| 81B | 6-434-7.5 | 9 | 24.5 | front | 31.4 | 0.592 | 0.810 | 15.1 | 0.97 |
|  |  |  | 21.2 | back | 30.5 | 0.586 | 0.807 | 14.4 |  |
| 51A | 6-430-1.11 | 19 | 24.5 | front | 31.4 | 0.590 | 0.790 | 14.6 | 0.97 |
|  |  |  | 21.2 | back | 30.5 | 0.587 | 0.814 | 14.6 |  |

Notes to Table 5:
1. Under the back illuminated conditions, the cell area was corrected to account for the added metal coverage. A value of 21.2 cm was used rather than 24.5 cm.
2. Cells have single layer AR coating and no surface passivation.
3. Back-to-front ratio of $J_{sc}$ is nearly unity indicating a hole diffusion length which significantly exceed cell thickness.
4. Measurement conditions: AM 1.5, 100 mW/cm$^2$, 25° C.
5. Cells processed in AESD Run 7001.

Large area (24.5 cm$^2$) bifacial cells have been fabricated on crystals produced in the antimony doped growth runs of the present invention. These cells were produced using the Westinghouse baseline process. A single layer of antireflective coating was applied by a standard dipping technique.

Figure 8:
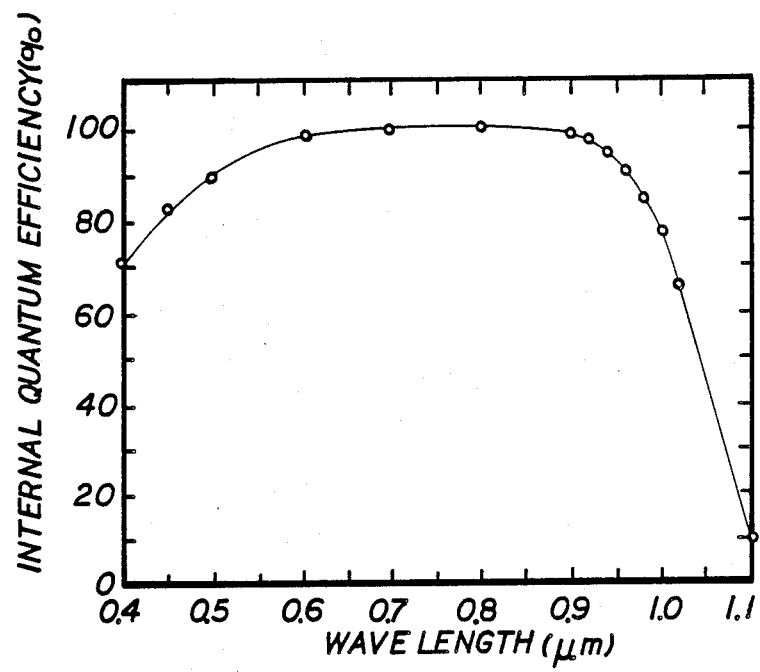
FIG. 8 is a graph illustrating the internal quantum efficiency versus wavelength for a photovoltaic cell produced from web crystal grown from a melt doped according to the present invention.

Table 4 gives data on seven such solar cells, having resistivities from 10–20 $\Omega$cm. The data further demonstrate that high efficiency cells can be fabricated from antimony doped web. The minority carrier diffusion length of representative cells was measured at 100–200 $\mu$m which indicates a good quality bulk material with FIG. 8 shows the internal quantum efficiency of cell 75B under front surface illumination as a function of wavelength. THe cell had a p$^{30}$ nn+ structure, a base doping of $4 \times 10^{14}$ atoms of antimony per cm$^3$ of web material, a thickness of 108 $\mu$m, and a $J_{sc}$(back)/$J_{sc}$(front) of 1.00. The cell has an excellent red and blue response. The diffusion length, obtained in the same manner as in FIG. 7, was 333 $\mu$m, again indicating a high quality bulk material which results in a high cell efficiency.

Table 6 shows a direct comparison between photovoltaic cell efficiencies of dendritic web crystals produced with the conventional phosphorous dopant and dendritic web crystals doped with antimony according to the present invention. The data in Table 6 was generated using identical processing steps, except that the dopants used during growth were different. The cells noted in this table were 25.4 cm² in area.

TABLE 6

PROPERTIES OF CELLS FABRICATED OF WEB DOPED WITH ANTIMONY OR PHOSPHOROUS

| PHOSPHOROUS DOPING | | ANTIMONY DOPING | |
|---|---|---|---|
| CELL ID | EFF % | CELL ID | EFF % |
| 18 | 13.9 | 12 | 14.2 |
| 19 | 13.7 | 16 | 13.9 |
| 17 | 13.9 | 17 | 14.7 |
| 21 | 13.6 | 18 | 13.9 |
| 22 | 13.9 | 49 | 13.8 |
| 77 | 14.0 | 53 | 14.4 |
| 78 | 13.9 | 20 | 14.0 |
| 79 | 13.8 | 10 | 13.7 |
| 86 | 13.6 | 75 | 15.3 |
| 87 | 13.6 | 81 | 15.3 |
| 88 | 13.7 | 87 | 14.2 |
| 89 | 13.5 | 51 | 14.6 |
| AVG | 13.8 | AVG | 14.3 |

This data conclusively demonstrates that the use of antimony as a dopant results in a noticeable and unexpected improvement in photovoltaic cell efficiency relative to cells produced from conventional phosphorous doped web.

The cell data given in this disclosure confirm that high quality cells can be fabricated on antimony doped web. This data, in addition to the experimental data demonstrating the uniformity of crystal resistivity without need for further doping over the course of the growth run indicate that antimony is an excellent dopant for producing n-type web.

Although the invention has been described in detail in the foregoing for the purpose of illustration, it is to be understood that such detail is solely for that purpose and that variations can be made therein by those skilled in the art without departing from the spirit and scope of the invention as described by the claims. For example, it is expected that those skilled in the art would understand that dendritic web crystals may be grown from melts other than silicon, such as qermanium and other Group IV elements, and that the antimony doping of such melts would have similar advantages to those described herein.

We claim:

1. A method for growing a silicon dewndritic web crystal exhibiting an n-type resistivity, said crystal exhibiting a uniform resistivity over the length of said crystal, said method comprising:
   a. placing a silicon charge in a crucible;
   b. melting said silicon;
   c. placing a quantity of antimony dopant in said charge, allowing said antimony to melt and diffuse into said silicon, thereby producing an antimony-doped silicon melt;
   d. growing a silicon dendritic web crystal from said antimony-doped silicon melt;
   f. replenishing said silicon melt with sufficient silicon to maintain a substantially constant silicon melt level as said crystal is pulled from said melt, said silicon replenishing being done without adding additional dopant to said melt;
   g. continuing to grow said crystal up to a crystal weight of at least 600 grams.

2. The method of claim 1 wherein said antimony is added to said melt in a quantity of at least $1.8 \times 10^{15}$ atoms of antimony per gram of silicon in said charge.

* * * * *